United States Patent [19]

Wodarczyk et al.

[11] Patent Number: 5,023,692
[45] Date of Patent: Jun. 11, 1991

[54] POWER MOSFET TRANSISTOR CIRCUIT

[75] Inventors: Paul J. Wodarczyk, Mountaintop; Carl F. Wheatley, Jr., Drums; John M. S. Neilson, Norristown; Frederich P. Jones, Mountaintop, all of Pa.

[73] Assignee: Harris Semiconductor Patents, Inc., Melbourne, Fla.

[21] Appl. No.: 447,330

[22] Filed: Dec. 7, 1989

[51] Int. Cl.$^5$ .................... H01L 27/02; H01L 29/04; H01L 29/10
[52] U.S. Cl. ........................................ 357/43; 357/46; 357/59; 357/23.4
[58] Field of Search ...................... 357/23.4, 43, 59 F, 357/46

[56] References Cited

U.S. PATENT DOCUMENTS

| | | | |
|---|---|---|---|
| 4,631,564 | 12/1986 | Neilson et al. | 357/23.4 |
| 4,860,080 | 8/1989 | Yilmaz | 357/23.4 |
| 4,893,158 | 1/1990 | Mihara et al. | 357/23.4 |

Primary Examiner—Rolf Hille
Assistant Examiner—Wael Fahmy
Attorney, Agent, or Firm—K. R. Glick

[57] ABSTRACT

The present invention relates to a power MOS transistor having a current limiting circuit incorporated in the same substrate as the transistor. The power MOS transistor includes a drain region extending through the substrate between opposed first and second surfaces, a plurality of body regions in the substrate at the first surface, a separate source region in the substrate at the first surface within each body region and a channel extending across each body region between its junction with its respective source region and its junction with the drain region. A conductive gate is over and insulated from the first surface and extends over the channel regions. A first conductive electrode extends over and is insulated from the gate and contacts a first portion of the source regions. A second conductive electrode extends over and is insulated from the gate and contacts a second portion of the source regions. The second portion contains a smaller number of the source regions than the first portion. The current limiting circuit includes a bipolar transistor formed in a well region in the substrate, a zener diode formed in a second well region in the substrate and two resistors formed over and insulated from the first surface. The current limiting circuit is connected between the second portion of the source regions and the gate so as to reduce the power through the circuit.

8 Claims, 6 Drawing Sheets

POWER MOSFET TRANSISTOR CIRCUIT

FIELD OF THE INVENTION

The present invention relates to a power MOSFET transistor circuit, and, more particularly, to a power MOSFET transistor having integrated therewith a circuit for protecting the transistor against direct shorts across the load or loads to the power supply.

BACKGROUND OF THE INVENTION

Figure 1:
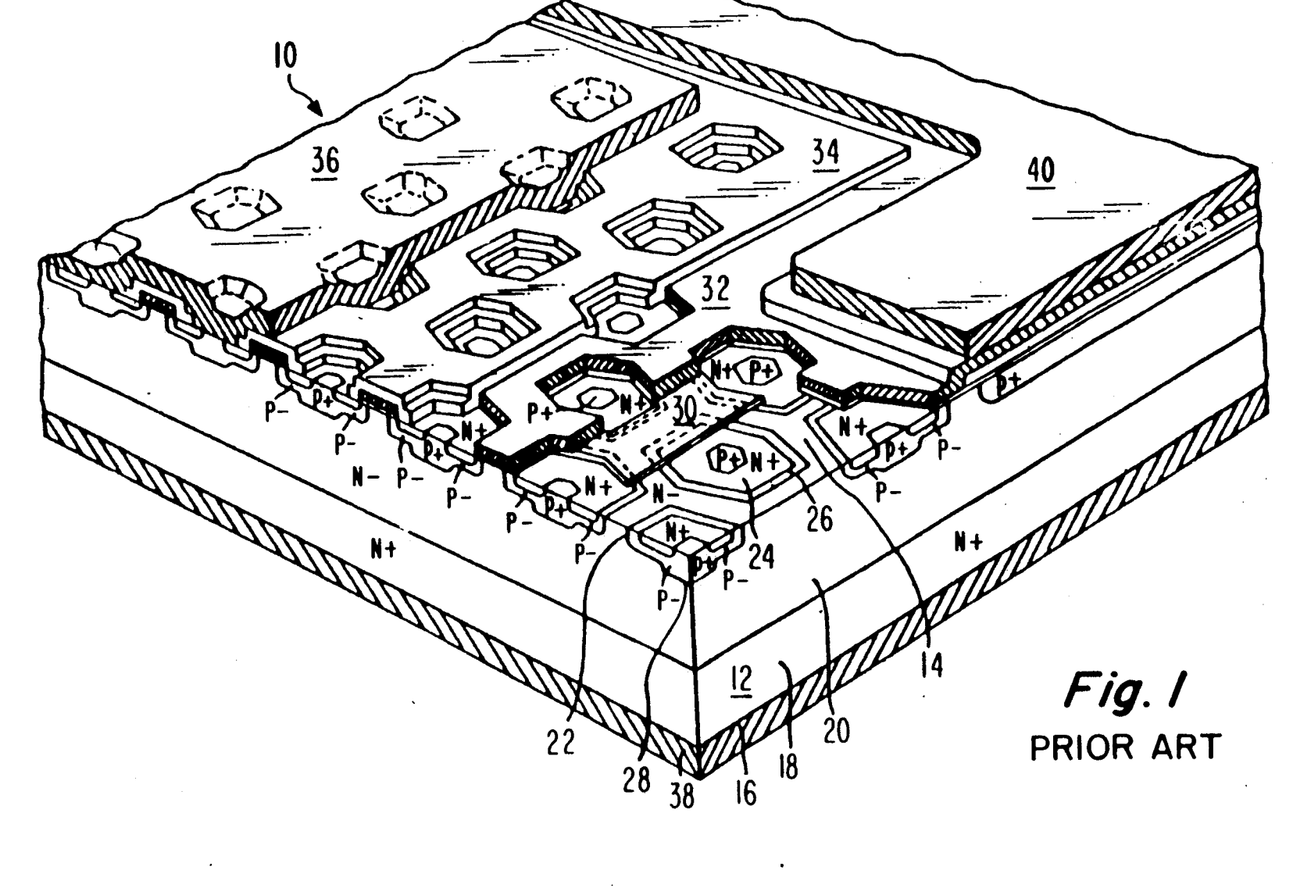
FIG. 1 is a perspective view of a portion of a power MOSFET of the prior art.

One type of power MOSFET transistor is a vertically diffused MOS (VDMOS) transistor. Such a power MOSFET transistor is described in U.S. Pat. No. 4,631,564 to J. M. S. Neilson et al, issued Dec. 23, 1986, entitled GATE SHIELD STRUCTURE FOR POWER MOS DEVICE. As shown in FIG. 1, a VDMOS transistor 10 basically comprises a substrate 12 of a semiconductor material of one conductivity type, such as N−type, having first and second opposed major surfaces 14 and 16. Disposed across the second major surface 16 is a relatively high conductivity region 18 of the one conductivity type, such as N+ type, referred to as the drain region. Contiguous with the N+ type drain region 18 is an N− type extended drain region 20 which extends to the first major surface 14.

Extending into the substrate 12 from the first surface 14 are a plurality of lightly doped body regions 22 of the opposite conductivity type, such as P− type. At the first surface 14, each of the body regions 22 is in the form of a hexagon. Extending into the substrate 12 from the first surface 14 within the boundary of each of the body regions 22 is a source region 24 of the one conductivity type, such as N+ type. At the first surface 14, each of the source regions 24 is also hexagonal with the edge of each source region 24 being spaced from the edge of its respective body region 22 so as to define the length and width of a channel region 26 at the first surface 14. Each of the source regions 24 is annular in shape and a P+ type supplementary body region 28 extends into the body region 22 within the source region 24 to a depth which is typically greater than that of the body region 22.

Disposed on the first surface 14 over the channel regions 26 is an insulated gate electrode which comprises gate insulation 30 on the surface 14 and a gate electrode 32 on the gate insulation 30. The gate insulation 30 is typically comprised of silicon dioxide in the thickness range of approximately 500 to 2,000 angstroms, and the gate electrode 32 typically comprises doped polycrystalline silicon. An insulating layer 34, typically comprising a silicate glass, overlies the gate electrode 32 so as to electrically isolate the electrode from overlying layers. A source electrode 36 overlies the insulating layer 34 and contacts the first surface 14 so as to contact the source regions and supplementary body regions. A drain electrode 38 contacts the high conductivity region 18 on the second surface 16. External electrical contact to the gate electrode 32 is made by a gate bond pad 40 which typically comprises a metal.

Figure 2:
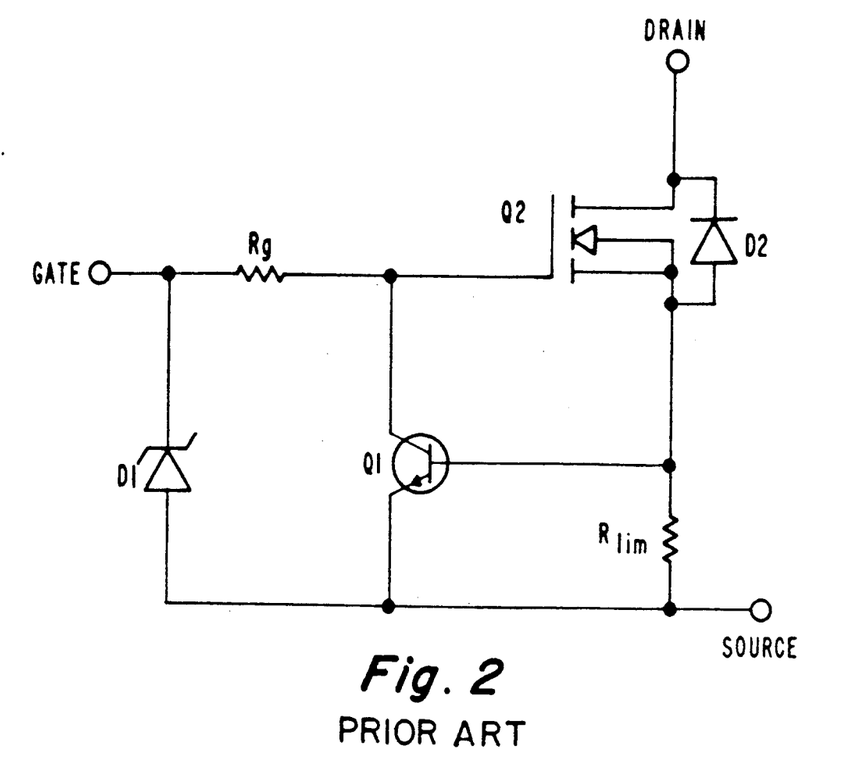
FIG. 2 is a schematic circuit diagram of a current limiting circuit for a power MOSFET of the prior art.

For certain applications of power MOSFET transistors, it is desirable to protect the transistor against direct shorts across the load or loads of the power supply. For this purpose, current limiting circuits have been used with the power MOSFET. FIG. 2 shows one circuit which has been used for this purpose. The circuit comprises a zener diode D1 across the gate and source terminals of the circuit. A bipolar transistor Q1 has its collector connected to the gate of the power MOSFET Q2 and its emitter connected to the source terminal of the circuit. The base of the bipolar transistor Q1 is also connected to the source of the MOSFET Q2. A current sensing resistor Rlim is connected to the source of the MOSFET Q2, across the base and the emitter of the bipolar transistor Q1 and to the source terminal of the circuit. A resistor $R_g$ is connected between the gate of the MOSFET Q2 and the gate terminal of the circuit to allow the switching speed of the device to be tailored by changing the input rc network time constant. The diode D2 is a parasitic diode built into the MOSFET Q2.

In the operation of this current limiting circuit, the zener diode D1 is used to protect the power MOSFET from electrostatic discharge. Current limiting is obtained when the load current in the power MOSFET Q2 is large enough (i.e. under a shorted load condition) so that the voltage across the limiting resistor Rlim is enough to provide a voltage across the base-emitter junction of the bipolar transistor Q1 which will turn on transistor Q1. When transistor Q1 is turned on, the gate voltage of the power MOSFET Q2 is pulled down through bipolar transistor Q1 and the load current is limited. However, a problem with this current limiting circuit is that the power across the current limiting resistor Rlim can become very high causing the resistor to heat up and adversely affect the operation of the circuit.

Therefore, it would be desirable to have a current limiting circuit for the power MOSFET in which the power dissipation across the power limiting resistor is lowered considerably. Also, it is desirable to have a current limiting circuit for a power MOSFET which can be integrated into the power MOSFET and can be constructed using the same method for making the power MOSFET.

SUMMARY OF THE INVENTION

The present invention relates to a power MOSFET in which some of the source regions of the MOSFET are connected together by a second source electrode which is spaced from and electrically isolated from the first or main source electrode connecting all of the other source regions. This provides the MOSFET with a sense or pilot group of sour TM e regions which contains a much fewer number of source regions than the remaining portion of the MOSFET. A current limiting circuit is connected between the second source electrode and the gate electrode of the MOSFET so that the current limiting circuit consumes only a small portion of the power associated with the MOSFET.

More particularly, the present invention relates to a power MOSFET comprising a substrate of a semiconductor material of one conductivity type having first and second opposed surfaces. A drain region extends through the substrate between the surfaces. A plurality of spaced body regions of the opposite conductivity type extend into the substrate from the first surface, and a separate source region of the one conductivity type extends into the substrate from the first surface within each of the body regions. The intercept of each source region and the first surface is spaced from the intercept of its respective body region and the first surface to form a channel region therebetween. A conductive gate is over and insulated from the first surface and extends over the channel regions. A first conductive electrode extends over and is insulated from the gate and contacts a portion of the source regions. A second conductive electrode extends over and is insulated from the gate and contacts a second portion of the source regions which contains a fewer number of the source regions than contained in the first portion. A current limiting circuit is connected between the second conductive electrode and the gate.

DETAILED DESCRIPTION OF PREFERRED EMBODIMENT

Figure 3:
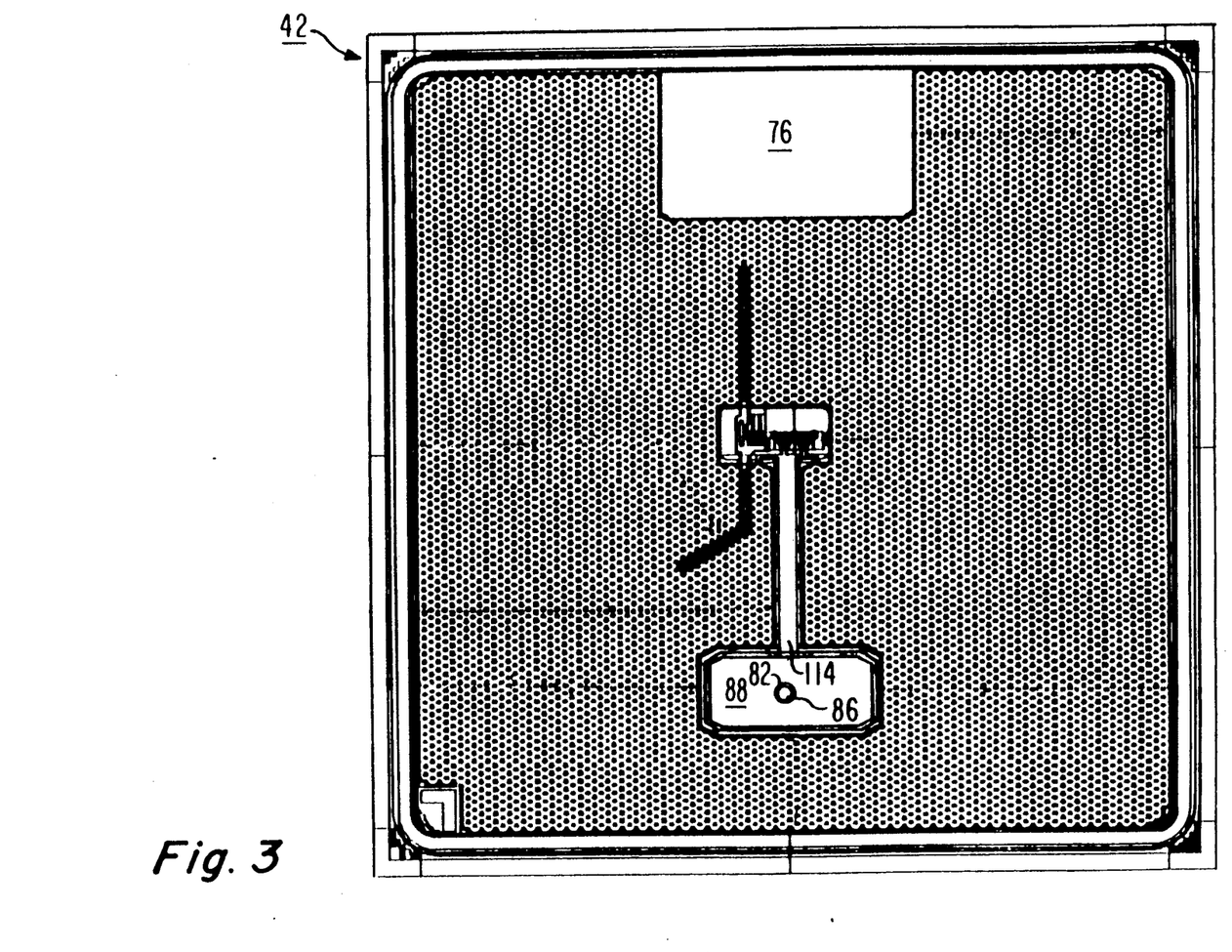
FIG. 3 is a top view of a power MOSFET of the present invention.
Figure 6:
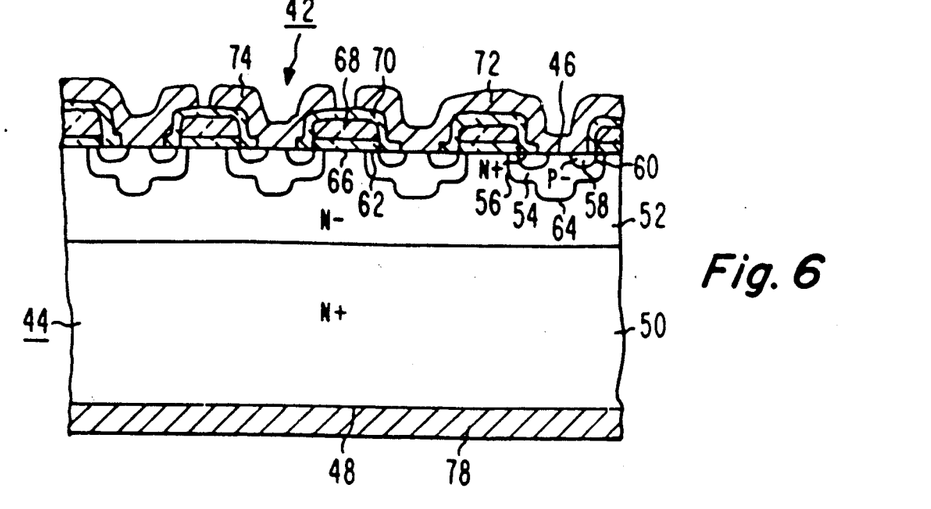
FIG. 6 is a sectional view taken along line 6—6 of FIG. 5.

Referring to FIGS. 3 and 6, the power MOSFET 42 of the present invention is similar to the VDMOS 10 shown in FIG. 1 in that it comprises a substrate 44 of a semiconductor material, such as silicon, having opposed first and second surfaces 46 and 48. Disposed across the second surface 48 is a relatively high conductivity region 50 of one conductivity type, shown as N+type, which is referred to as the drain region. Contiguous with the drain region 50 and extending to the first surface 46 is a low conductivity region 52 of the one conductivity type, shown as N− type, which is referred to as the extended drain region.

Extending into the substrate 44 from the first surface 46 are a plurality of spaced low conductivity body regions 54 of the opposite conductivity type, shown as P− type. Each of the body regions 54 forms a body/drain PN junction 56 with the extended drain region 52, the intercept of which with the first surface 46 is in the form of a hexagon. The body regions 54 are arranged along the first surface 46 in an array of rows and columns. Extending into the substrate 44 from the first surface 46 within the boundary of each of the body regions 54 is a high conductivity source region 58 of the one conductivity type, shown as N+ type which forms a source/body PN junction 60 with its respective body region 54. Each source region 58 and its associated body region 54 is commonly referred to as a source/body cell. Although FIGS. 4 and 5 do not show all of the source/body cells, it should be understood that the source/body cells extends across the entire substrate as shown in FIG. 3. Each source/body PN junction 60 is spaced from a respective body/drain PN junction 56 at the first surface 46 to define the length and width of a channel region 62 in the body region 54 at the first surface 46. The source regions 58 are annular in shape and the outer portions of the source/body PN junctions 60 intercept the first surface 46 in the form of hexagons which are concentric with the corresponding body/drain PN junction 56 intercepts. Extending from the first surface 46 into the central portion of each body region 54, and surrounded by the annular source region 58, is a highly conductive supplementary body region 64 of the opposite conductivity type, shown as P+ type. The supplementary body region 64 extends to a depth which is typically greater than that of the body regions 54.

Disposed on the first surface 46 and over the channel regions 62 is an insulated gate electrode which comprises gate insulation 66 on the first surface 46 and a gate electrode 68 on the gate insulation 66 The gate insulation 66 is typically comprised of silicon dioxide in the thickness range of approximately 500 to 2,000 angstroms and the gate electrode 68 typically comprises doped polycrystalline silicon. An insulating layer 70, typically comprising a silicate glass, such as phosphosilicate glass (PSG), borosilicate glass (BSG) or borophosphosilicate glass (BPSG), overlies the gate electrode 68 so as to electrically isolate the electrode from overlying layers. A first source electrode 72 overlies the insulating layer 70 and contacts the source regions 58 and supplementary body regions 64 of a first portion of the source/body cells. A second source electrode 74 overlies the insulating layer 70 and contacts the source regions 58 and supplementary body regions 64 of a second portion of the source/body cells. The number of source/body cells contained in the second portion is much smaller than the number of source/body cells in the first portion. Typically, the number of source/body cells in the second portion contacted by the second source electrode 74 is about 1/250 of the total number of source/body cells in the substrate 44. The second portion of the source/body cells will be referred to as the "pilot" portion. The first source electrode 72 extends to a source contact pad 76 which overlies a portion of the first surface 46 which typically does not contain any source/body cells. A drain electrode 78 is on the second surface 48 and contacts the drain region 50.

Figure 4:
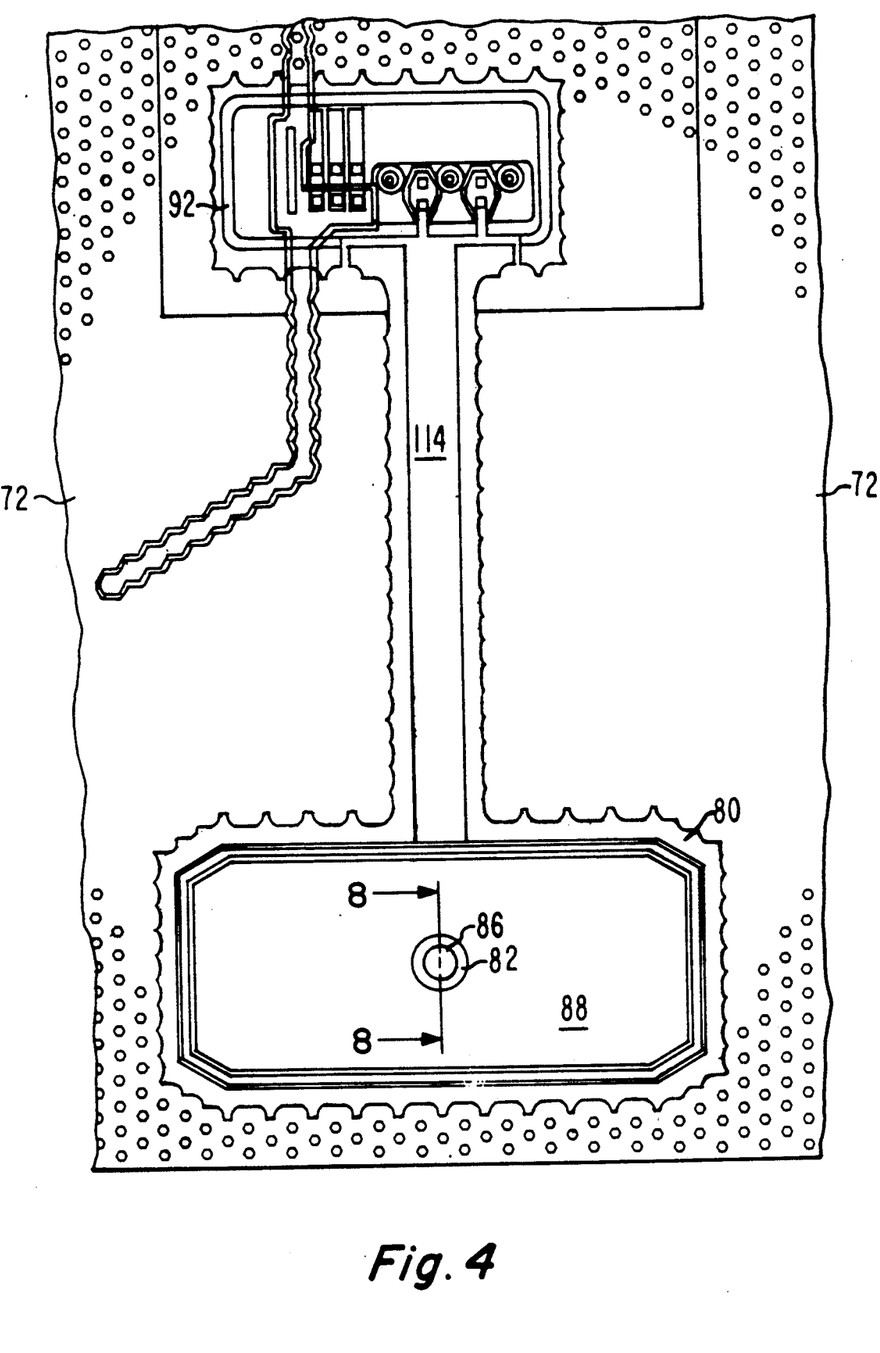
FIG. 4 is an enlarged top view of a portion of the power MOSFET shown in FIG. 3.
Figure 8:
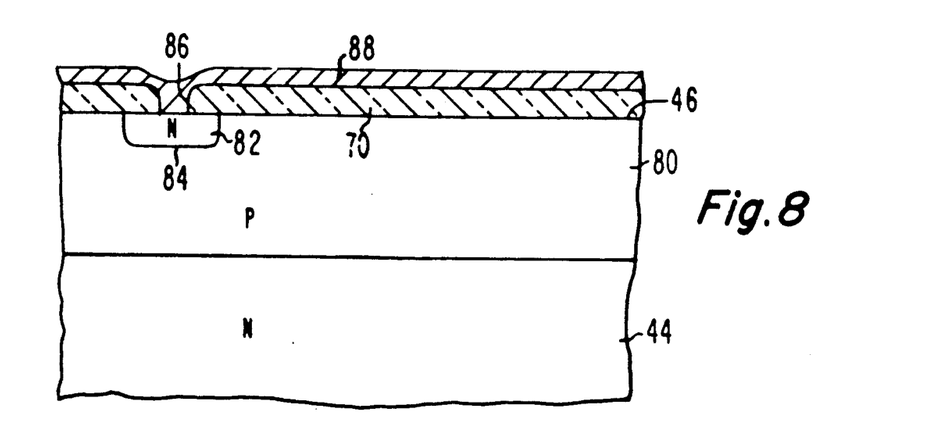
FIG. 8 is a sectional view taken along line 8—8 of FIG. 4.

As shown in FIGS. 3, 4 and 8, a first well 80 of the opposite conductivity type, shown as P-type, extends into the substrate 44 from the first surface 46 in an area of the first surface 46 which does not contain any source/body cells. A region 82 of the one conductivity type, shown as N-type, extends into the substrate 44 from the first surface 46 within the first well 80 and forms a PN junction 84 with the well 80. Region 82 is designed to form a zener diode D1 in the well 80. A gate bond pad 88, typically of a metal, extends over the area of the first surface 44 which does not contain source/body cells and which contains the first well 80 and is insulated therefrom by the insulating layer 70. The gate bond pad 88 extends through an opening 86 in the insulating layer 70 to contact region 82 of the zener diode D1.

Figure 5:
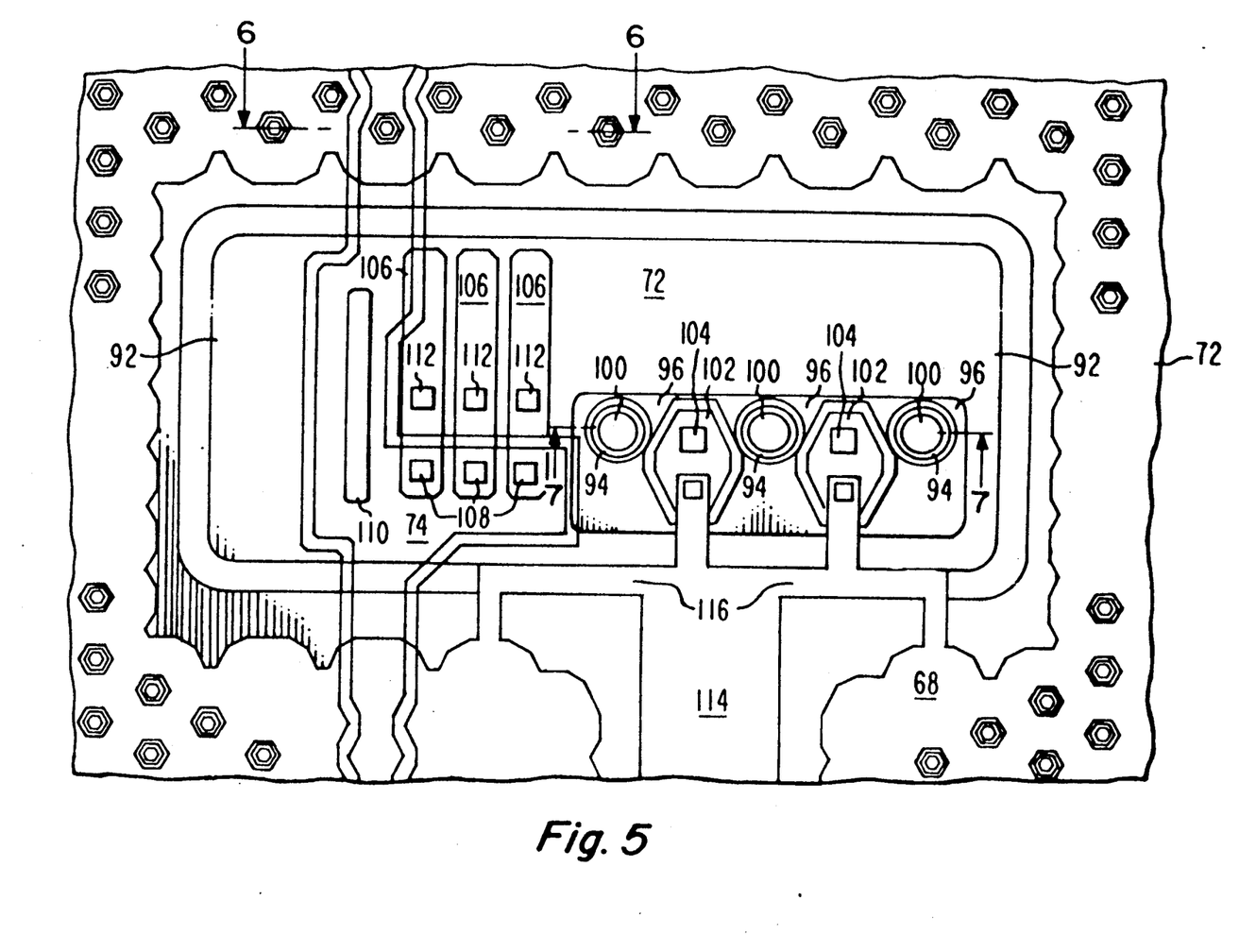
FIG. 5 is a further enlarged top view of a portion of the power MOSFET shown in FIG. 4
Figure 7:
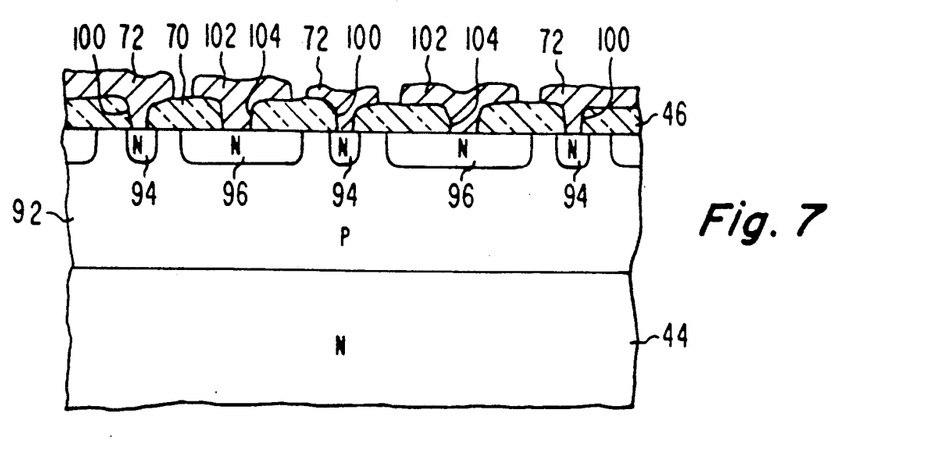
FIG. 7 is a sectional view taken along line 7—7 of FIG. 5.

As shown in FIGS. 4, 5 and 7, a second well 92 of the opposite conductivity type, shown as P-type, extends into the substrate 44 from the first surface 46 in another area of the first surface 46 which does not contain source/body cells and which is spaced from the area of the first surface 46 which contains the zener diode D1. A plurality of small regions 94 of the one conductivity type, shown as N-type, extend into the substrate 44 from the first surface 46 within the second well 92. A larger region 96 of the one conductivity type, shown as N-type, extends into the substrate 44 from the first surface 46 within the second well 92 and surrounds the small regions 94. The well 92 and the regions 94 and 96 form a lateral bipolar transistor Q1 in which the small regions 94 are the emitters, the larger region 96 is the collector and the well 92 is the base. The insulating layer 70 extends over the second well 92. First source electrode 72 extends through openings 100 in the insulating layer 70 to contact the emitter region 94, and collector contacts 102 extend through openings 104 in the insulating layer 70 to contact the collector region 96.

Disposed over the second well 92 and on the insulation layer 66 are a plurality of spaced, parallel, narrow strips 106 of doped polycrystalline silicon which form a resistor $R_p$. The resistor strips 106 are covered by the insulating layer 70. The second source electrode 74 extends across the second well 92 and through openings 108 in the insulating layer 70 to contact the resistor strips 106 at one end thereof. The second source electrode 74 also extends through an opening 110 in the insulating layer 70 to contact the second well 92 and thereby connect the second source electrode 74 to the base of the bipolar transistor Q1. The first source electrode 72 extends over the second well 92 and through openings 112 in the insulating layer 70 to contact the resistor strips 106 spaced from the ends thereof. The first source electrode 72 also makes contact to the emitter contacts 98 of the bipolar transistor Q1. A strip 114 of doped polycrystalline silicon extends over and is insulated from the first surface 46 across an area of the first surface 46 which does not contain any source/body cells between the first well 80 and the second well 92. The strip 114 forms a 30 resistor $R_g$. One end of the resistor strip 114 is connected to the portion of the gate bond pad 88 over the first well 80 so as to be connected to one side of the zener diode D1. At the other end of the resistor strip 114 a connection 116 extends to and makes contact with the gate electrode 68 so that the other end of the resistor $R_g$ is connected to the gate of the power transistor Q2. The connection 116 also makes contact with the collector contacts 102 so that the resistor $R_g$ is also connected to the collector of the bipolar transistor Q1.

Figure 9:
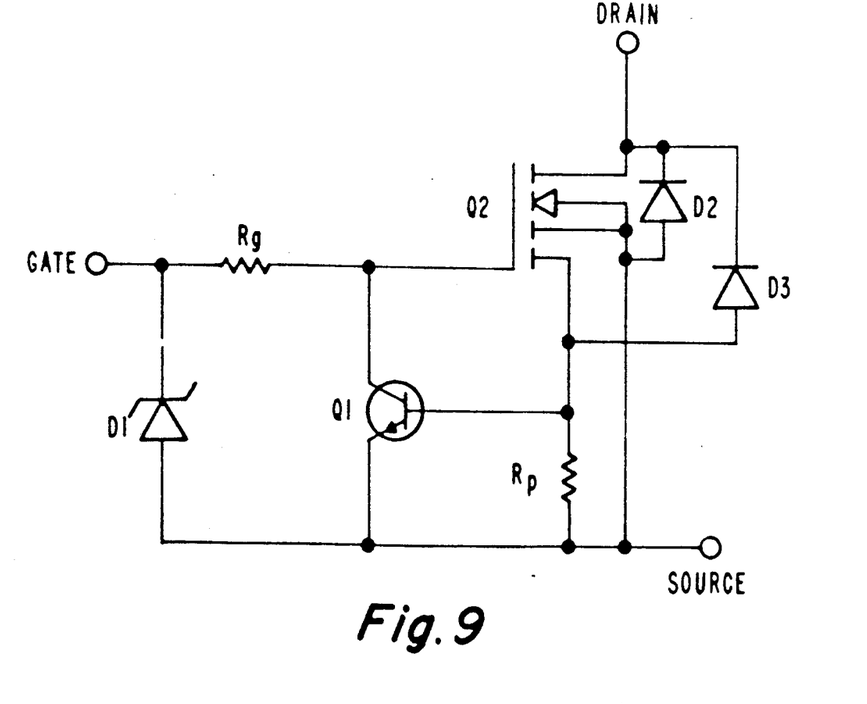
FIG. 9 is a schematic circuit diagram of the MOSFET of the present invention.

The above structure provides a power MOSFET having a current limiting circuit therein as shown in FIG. 9. The zener diode D1 formed by the N-type region 82 in the first well 80 has one side connected to the gate pad 88 and the other side connected to first source electrode 72 through first well 80. One end of the resistor $R_g$ formed by the strip 114 is connected to gate bond pad 88 and the other end of the resistor $R_g$ is connected by the connection 116 to the gate electrode 68 of the power MOSFET Q2 and to the collector 96 of the bipolar transistor Q1 through the collector contacts 102. The base of the bipolar transistor Q1 formed by the second well 92 is connected to the source regions 58 of the pilot portion of the source/body cells through the second source electrode 74. The base of the bipolar transistor Q1 and the source regions 58 of the pilot portion of the source/body cells are also connected by the second source electrode 74 to one end of the resistor strips 106 forming resistor $R_p$. The other end of resistor $R_p$ is connected by the first source electrode 72 to the source regions 58 of the first portion of the source/body cells and to the source electrode pad 76. The source regions 58 of the first portion of the source/body cells are also connected by the first source electrode 72 to the emitters 94 of the bipolar transistor Q1 through the emitter contacts 98 and to the other side of the zener diode D1. The diodes D2 and D3 are the parasitics formed in the power MOSFET structure and provide the avalanche voltage value for the device.

Thus, in the power MOSFET 42 of the present invention, the current limiting circuit is connected across the gate of the power MOSFET Q2 and the source regions of the pilot portion of the source/body cells. The current limiting circuit operates in the same manner as described above for the current limiting circuit shown in FIG. 2. However, since the circuit is connected across the pilot portion of the source/body cells, which contains much fewer cells than the total number of cells in the MOSFET, the current flowing within the resistor $R_p$ to turn on the bipolar transistor Q1 is much smaller. Thus, the power dissipation within the resistor $R_p$ is much smaller. For a power MOSFET having a pilot portion which contains 1/250th the number of source/body cells contained in the entire power MOSFET, the power dissipation within the resistor $R_p$ is reduced by a factor of 250.

Although the power MOSFET 42 has the various components of the current limiting circuit incorporated therein, it can still be made using the steps of a standard method for making power MOSFET's. For example, the P-type conductivity first and second wells 80 and 92 are formed at the same time as the P-type conductivity body regions 54. The N-type region 82 of the zener diode D1 and the N-type emitter and collector regions 94 and 96 of the bipolar transistor Q1 are formed at the same time as the N-type conductivity source regions 58. The strips 106 forming the resistor $R_p$ and the strip 114 forming the resistor $R_g$ are formed from the same doped polycrystalline silicon layer which forms the gate electrode 68. The second source electrode 74 is formed from the same layer of conductive material which forms the first source electrode 72 Thus, no additional steps are required to make the power MOSFET 42 with the current limiting circuit therein.

Thus, there is provided by the present invention a power MOSFET having a current limiting circuit formed in the same substrate containing the power MOSFET. The current limiting circuit is connected between a pilot portion of the source regions of the MOSFET and the gate electrode so that the power dissipated within the current limiting circuit is greatly reduced over the prior art circuit. Also, the current limiting circuit can be formed in the power MOSFET using the same steps as normally used to form a power MOSFET so that the cost of forming the MOSFET with the current limiting circuit is not substantially increased over that of forming a power MOSFET alone.

What is claimed is:

1. A power MOS transistor comprising
a substrate of a semiconductor material of one conductivity type having first and second opposed surfaces;
a drain region extending through said substrate between said surfaces;
a plurality of spaced body regions of the opposite conductivity type in said substrate at said first surface, each of said body regions forming a body/drain junction with the drain region;
a separate source region of the one conductivity type in said substrate at the first surface and within each body region, each of said source regions forming a source/body junction with its respective body region which is spaced from the body/drain junction of its respective body region to form a channel region therebetween along the first surface, each of the source regions and its respective body region forming a source/body cell;

a conductive gate over and insulated from said first surface and extending across the channel regions;

a first conductive electrode over and insulated from said gate and contacting a first portion of the source/body cells;

a second conductive electrode over and insulated from said gate and contacting a second portion of the source/body cells, the number of source/body cells in the second portion being smaller than the number in the first portion;

a bipolar transistor in said substrate at said first surface having a collector region, an emitter region and a base region;

a diode in the substrate at said first surface, said diode having first and second regions of opposite conductivity type; and first and second resistors over and insulated from said first surface;

one end of the first resistor being connected to one side of the diode and the other end of the first resistor being connected to the collector of the bipolar transistor and the gate;

one end of the second resistor being connected to the base of the bipolar transistor and the second electrode; and the emitter of the bipolar transistor being connected to the other side of the diode and to the first electrode.

2. A power MOS transistor in accordance with claim 1 in which the bipolar transistor comprises a well region of the opposite conductivity type in the substrate at the first surface serving as the base, at least one region of the one conductivity type in the substrate at the first surface within the well region serving as the collector, and at least one region of the one conductivity type in the substrate at said surface within the well region serving as the emitter.

3. A power MOS transistor in accordance with claim 2 in which the bipolar transistor includes a plurality of the emitter regions in spaced relation in the base region, and a separate collector region surrounding each of the emitter regions.

4. A power MOS transistor in accordance with claim 2 in which the diode comprises a well region of the opposite conductivity type in the substrate at said first surface, and a region of the one conductivity type in the substrate at said first surface within said well region.

5. A power MOS transistor in accordance with claim 4 in which each of the resistors comprises a strip of a partially conductive material over and insulated from said first surface.

6. A power MOS transistor in accordance with claim 5 in which the strip forming the second resistor is over the well region containing the bipolar transistor.

7. A power MOS transistor in accordance with claim 6 in which the second resistor comprises a plurality of spaced parallel strips of the partially conductive material.

8. A power MOS transistor in accordance with claim 6 in which the strip forming the first resistor extends between the two well regions.

* * * * *